United States Patent [19]
Arimilli et al.

[11] Patent Number: 5,548,797
[45] Date of Patent: Aug. 20, 1996

[54] DIGITAL CLOCK PULSE POSITIONING CIRCUIT FOR DELAYING A SIGNAL INPUT BY A FIST TIME DURATION AND A SECOND TIME DURATION TO PROVIDE A POSITIONED CLOCK SIGNAL

[75] Inventors: Ravi K. Arimilli, Round Rock; John S. Dodson, Pflugerville; Jerry D. Lewis, Round Rock, all of Tex.

[73] Assignee: International Business Machines Corporation, Armonk, N.Y.

[21] Appl. No.: 316,976

[22] Filed: Oct. 3, 1994

[51] Int. Cl.$^6$ .............................. G06F 1/04; G06F 13/14
[52] U.S. Cl. .................. 395/880; 395/200.19; 395/550; 395/878; 375/242; 364/270; 364/270.3; 364/271.5
[58] Field of Search ................................. 395/821, 550, 395/878, 880, 200.19; 375/25

[56] References Cited

U.S. PATENT DOCUMENTS

| | | |
|---|---|---|
| 3,941,989 | 3/1976 | McLaughin et al. . |
| 4,797,552 | 1/1989 | Steel et al. . |
| 4,802,120 | 1/1989 | McCoy ................................. 364/900 |
| 4,899,273 | 2/1990 | Omoda et al. ........................ 364/200 |
| 5,008,636 | 4/1991 | Markinson et al. . |
| 5,233,615 | 8/1993 | Goetz ..................................... 371/36 |
| 5,305,452 | 4/1994 | Khan et al. ............................ 395/550 |
| 5,367,204 | 11/1994 | Mattison ................................ 327/75 |
| 5,396,598 | 3/1995 | Anderson et al. ..................... 395/275 |

Primary Examiner—Thomas C. Lee
Assistant Examiner—Rehana Perveen Kriek
Attorney, Agent, or Firm—Anthony V. S. England; Jenkens & Gilchrist, P.C.

[57] ABSTRACT

An input/output channel controller includes a storage array for temporarily storing data and multiple clocks to access or update the data. One or more array clock signals are generated from a system clock combined with other clock signals to generate a single clock signal which is positioned in time by a clock positioning circuit to accommodate circuit throughput delay variations and to effectively reduce hold time to zero. Storage arrays may be clocked at significantly higher frequencies and arrays may have multiple gated clocks without incurring the hold time problems.

12 Claims, 3 Drawing Sheets

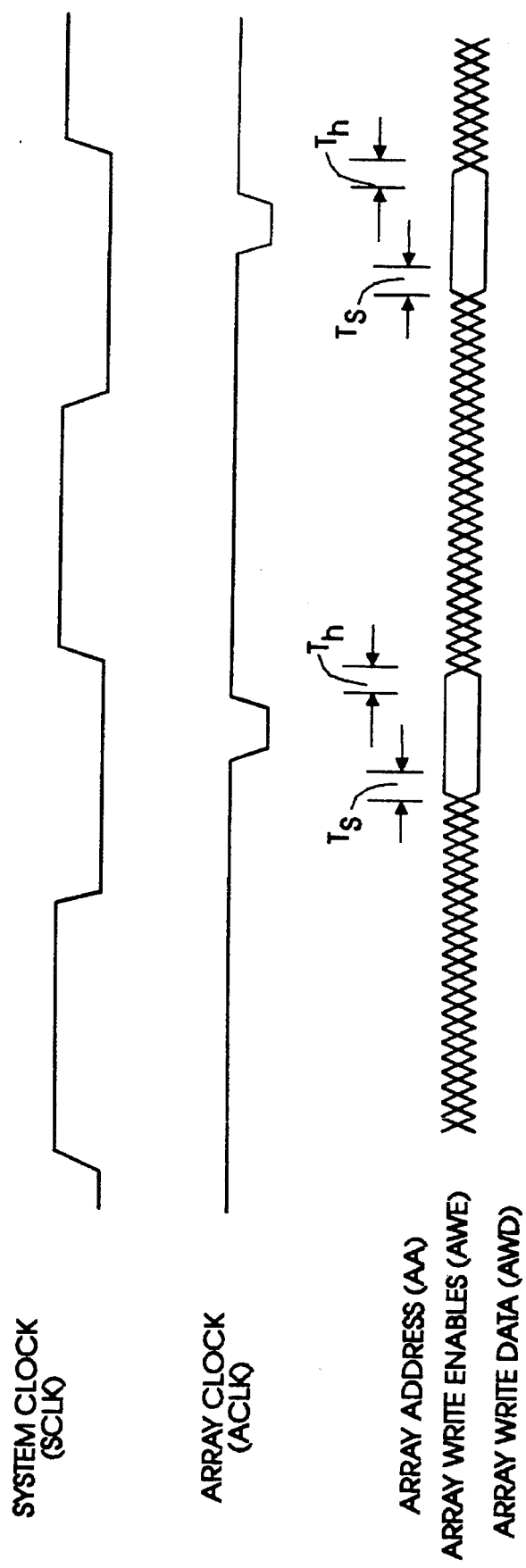

DIGITAL CLOCK PULSE POSITIONING CIRCUIT FOR DELAYING A SIGNAL INPUT BY A FIST TIME DURATION AND A SECOND TIME DURATION TO PROVIDE A POSITIONED CLOCK SIGNAL

CROSS REFERENCE TO RELATED APPLICATIONS

This application for patent is related to the following applications for patent filed concurrently herewith:

EFFICIENT ADDRESS TRANSFER TECHNIQUE FOR A DATA PROCESSING SYSTEM, Ser. No. 08/317,007 (now pending);

DUAL LATENCY STATUS AND COHERENCY REPORTING FOR A MULTIPROCESSING SYSTEM, Ser. No. 08/316,980 (now pending);

SYSTEM AND METHOD FOR DETERMINING SOURCE OF DATA IN A SYSTEM WITH INTERVENING CACHES, Ser. No. 08/317,256 (now pending);

QUEUED ARBITRATION MECHANISM FOR DATA PROCESSING SYSTEM, Ser. No. 08/317,006 (now pending);

METHOD AND APPARATUS FOR REMOTE RETRY IN A DATA PROCESSING SYSTEM, Ser. No. 08/316,978 (now pending);

DATA PROCESSING SYSTEM HAVING DEMAND BASED WRITE THROUGH CACHE WITH ENFORCED ORDERING, Ser. No. 08/316,979 (now pending);

COHERENCY AND SYNCHRONIZATION MECHANISMS FOR I/O CHANNEL CONTROLLERS IN A DATA PROCESSING SYSTEM, Ser. No. 08/316,977 (now pending);

ALTERNATING DATA VALID CONTROL SIGNALS FOR HIGH PERFORMANCE DATA TRANSFER, Ser. No. 08/326,190 (now pending);

LOW LATENCY ERROR REPORTING FOR HIGH PERFORMANCE BUS, Ser. No. 08/326,203 (now pending).

Each of such cross-referenced applications are hereby incorporated by reference into this Application as though fully set forth herein.

BACKGROUND OF THE INVENTION

1. Field of the Invention

The present invention relates to data processing systems, and more particularly to data processing systems including one or more processors, and one or more input/output channel controllers, wherein the system has a plurality of clock timing signals.

2. Prior Art

Input/output channel controllers ("IOCC") are normally used in computer systems to generate industry standard input/output buses from high performance system/memory buses. These IOCCs typically contain large arrays for temporarily storing data as well as multiple clock signals to access or update dam.

These prior art systems present fundamental problems in achieving acceptable chip cycle times. First, standard array designs require that the array address and array write enables be valid and stable during the clock "active" time, i.e. "high" level or "low" level based on array design. For ease of understanding, this invention assumes the clock "active" time to be the "low" level. This means that the array address and array write enables must stabilize in less than one-half of the total clock cycle time, due to the clock "active" setup time requirements and variations in the clock duty cycle. Second, these arrays have significant hold time requirements, and most IOCC chip designs aggravate this problem with the use of multiple gated clocks to update the array.

A prior art method to solve the hold time problem was to add a fixed delay to the array address and array write enable signals. However, adding these delays reduces the critical half cycle path during the next cycle. Further, such delays would require a significant amount of hardware to delay these array inputs.

SUMMARY OF THE INVENTION

Therefore, it is an object of the present invention to generate array clock signals which allow array address and enable signals maximum time to become stable.

It is another object of the present invention to generate array clock signals, in a system having more than one clock, while minimizing hold time problems normally associated with multiple clock systems.

Accordingly, an input/output channel controller includes a storage array for temporarily storing data and multiple clocks to access or update the data. One or more array clock signals are generated from a system clock combined with other clocking signals to generate a single clocking system which is positioned in time by a clocking positioning circuit to accommodate circuit throughput delay variations and to reduce hold time to zero. Storage arrays may then be clocked at significantly higher frequencies and may also have multiple gated clocks without incurring the hold time problems.

It is an advantage and feature of the present invention that an array clocking signal or signals may be generated in an I/O channel controller which adjusts for circuit delay variations from time to time and chip to chip and which minimizes hold time constraints relative to address or write enable inputs to the array.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 3 is a timing diagram showing clock signals input to and output from an array clock positioning circuit and bus signals input to a storage array in accordance with the present invention.

DETAILED DESCRIPTION OF A PREFERRED EMBODIMENT OF THE INVENTION

With the foregoing hardware in mind, it is possible to explain the process-related features of the present invention. To more clearly describe these features of the present invention, discussion of other conventional features is omitted as being apparent to those skilled in the art. It is assumed that those skilled in the art are familiar with a multiuser, multiprocessor operating system, and in particular with the requirements of such an operating system for memory management including virtual memory, processor scheduling, synchronization facilities for both processes and processors, message passing, ordinary device drivers, terminal and network support, system initialization, interrupt management, system call facilities, and administrative facilities.

Figure 1:
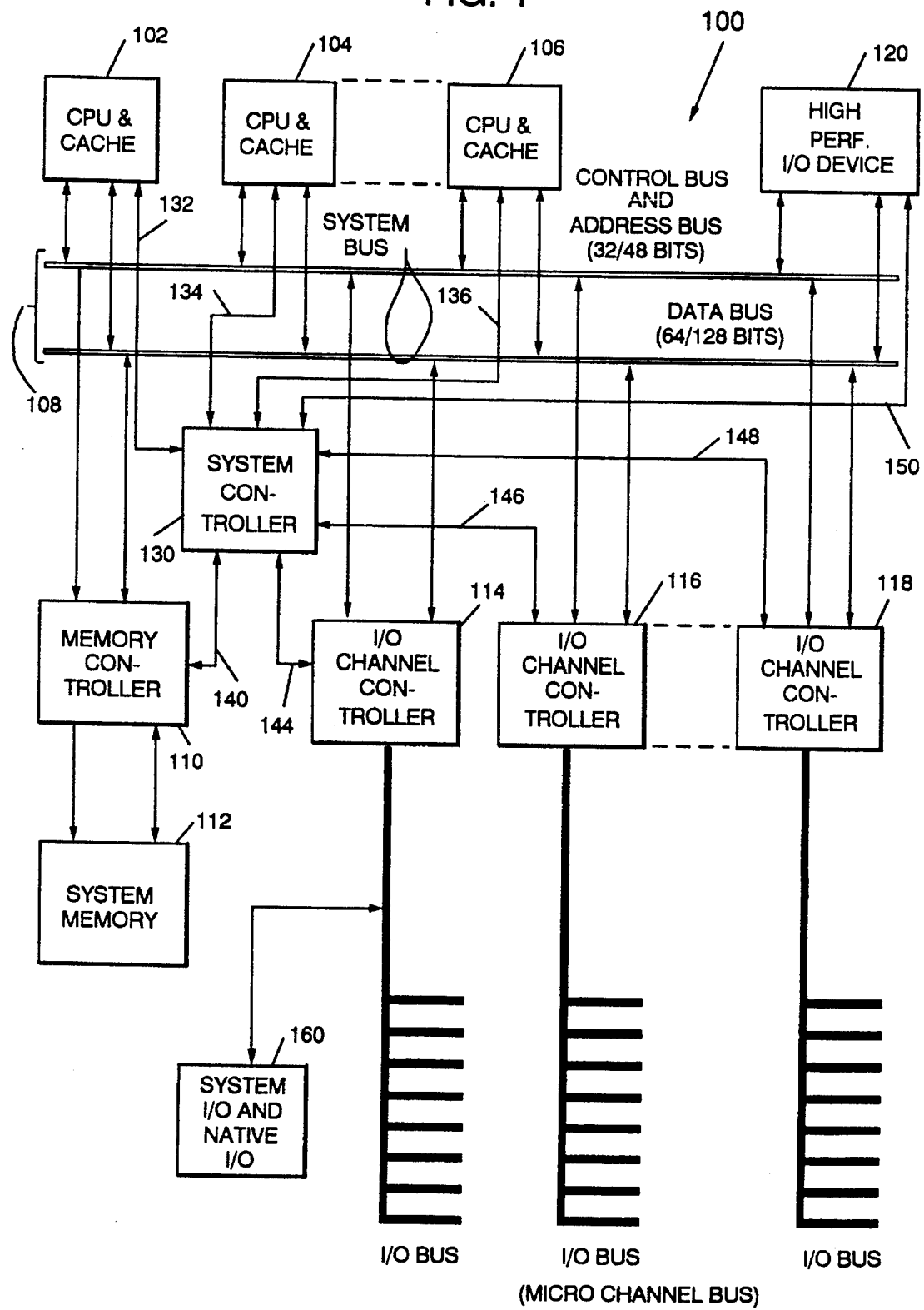
FIG. 1 is a system block diagram of a data processing system embodying the present invention.

Referring now to FIG. 1, a data processing system which advantageously embodies the present invention will be described. Multiprocessor system 100 includes a number of processing units 102, 104, 106 operatively connected to a system bus 108. Also connected to the system bus 108 is a memory controller 110, which controls access to system memory 112, and I/O channel controllers 114, 116, and 118. Additionally, a high performance I/O device 120 may be connected to the system bus 108. Each of the system elements described 102–120, inclusive, operate under the control of system controller 130 which communicates with each unit connected to the system bus 108 by point to point lines such as 132 to processor 102, 134 to processor 104, 136 to processor 106, 140 to memory controller 110, 144 to I/O channel controller 114, 146 to I/O channel controller 116, 148 to I/O channel controller 118, and 150 to high performance I/O device 120. Requests and grants of bus access are all controlled by system controller 130.

I/O channel controller 114 controls and is connected to system I/O subsystem and native I/O subsystem 160.

Each processor unit 102, 104, 106 may include a processor and a cache storage device.

Figure 2:
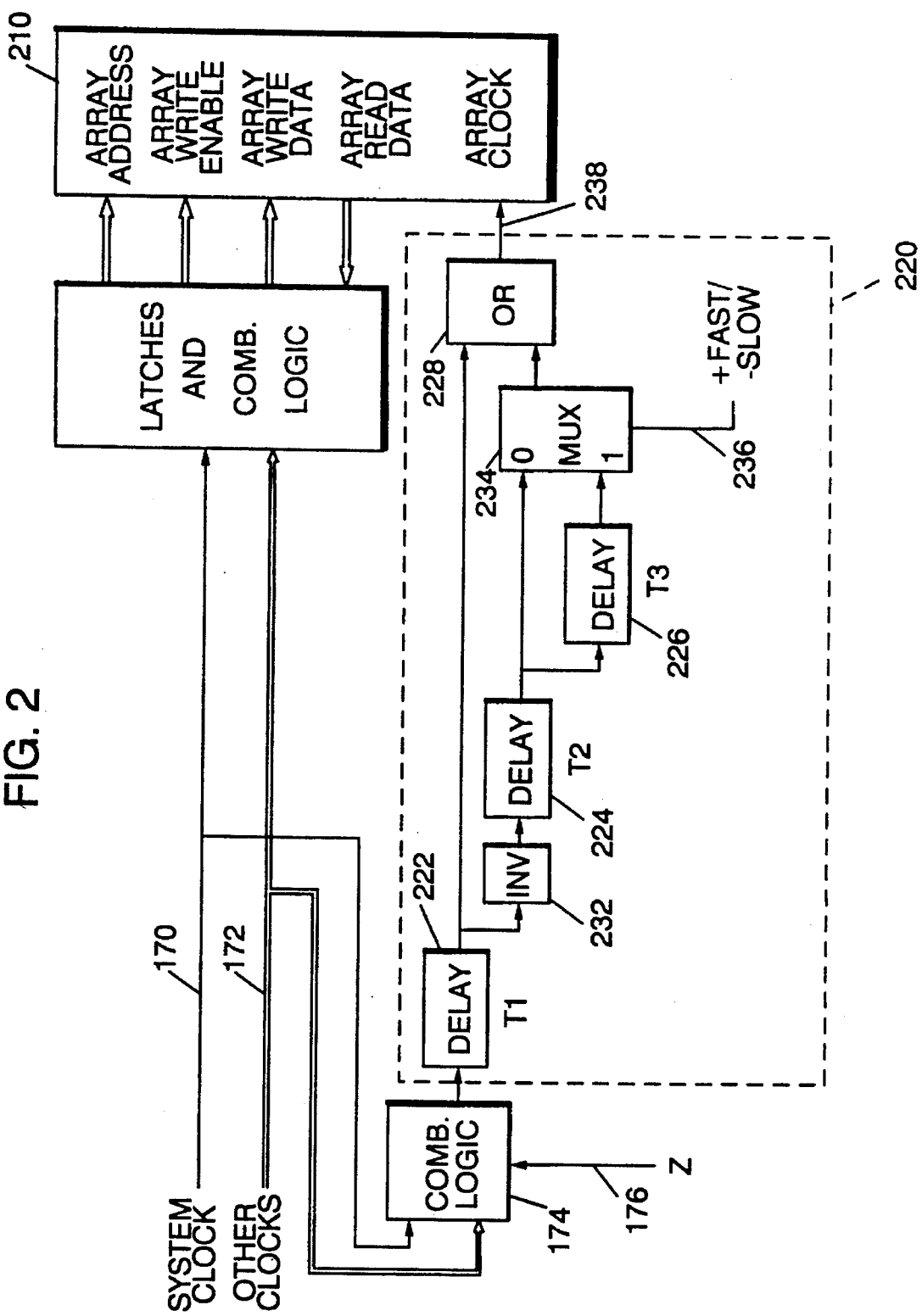
FIG. 2 is a circuit block diagram of a clocking system for generating an array clock signal in an I/O channel controller of FIG. 1.

System controller 130 generates among other signals a system clock signal 170 (see FIG. 2). The system clock signal is used in conjunction with other clocking signals which may be generated in I/O channel controllers 114, 116 and 118 to produce one or more array clocking signals to efficiently access storage array 210. The system clock on line 170 is combined with other clocks on lines 172 which may be generated, for example, within an I/O channel controller such as 114. The system clock and the other clocks are combined in combinatorial logic 174 to produce a single clocking signal input to array clock positioning circuit 220. Circuits for selection of 1 of n clock signals are well known in the art. Clock selection is done prior to array select.

Array clock positioning circuit 220 includes three delay circuits, 222, 224 and 226. The time delay in delay circuits 224 and 226 is set to be equal. The time delay in delay circuit 222 is greater than zero and is determined by the following equations: T1 (delay circuit 222)=$T_A$ minus $T_2$ (delay time in delay circuit 224). Wherein, T2 (delay circuits 224 and 226)=$1.5 \times T_B$.

$T_A$ is defined as the minimum gated clock low time, which is the shortest active time in each clock cycle for any of a number of clock signals in a multiple clock system, and $T_B$ is defined as the minimum array clock pulse width required where the minimum pulse width is defined by the specification of array 210.

Thus, if $T_B$ is 3 ns, the delay in delay circuits 224 and 226 would each be 4.5 ns. The time delay in delay circuit 222 would be $T_A$ minus 4.5 ns so long as the time delay in delay circuit 222 is greater than 0.

In a typical system, $T_A$ may be 15 ns, causing $T_1$ to be 11.5 ns. Input Z to combinational logic 174 on line 176 sets the minimum gated clock low time, $T_A$ based on an initial test of circuit delays.

The time delay in OR 228, MUX 234 Inverter 232 and wiring of the circuit are considered to be small. However, T1 and T2 may be required to be adjusted based on delay in other circuit elements.

The single clock input to array clock position circuit 220 is input to delay circuit 222. Outputs of delay circuit 222 are connected to OR circuit 228. The output 238 of which is the array clock signal to array 210. The output of delay circuit 222 is also connected to an inverter circuit 232 which provides an inverted delayed clock signal input to delay circuit 224. The output of delay circuit 224 is connected to a first input of multiplexor 234 and to an input of delay circuit 226, the output of which is connected to a second input of multiplexor 234. The output of multiplexor 234 is connected to a second input of OR circuit 228. The selection as between the output of delay circuit 224 and the output of delay circuit 226 in multiplexor 234 is controlled by a fast/slow signal on line 236.

The circuit shown in FIG. 2 and the timings which are shown in FIG. 3 rely on two basic properties of silicon based integrated circuits. Each integrated circuit has tight "on chip tracking characteristics." For example, a 3 input NAND gate with a certain fan out and load will have substantially the same propagation delay as another 3 input NAND gate with the same fan out and load on the same chip. However, the absolute value of the delay will vary from chip to chip (due to fabrication process variations). Second, due to fabrication process variations, the best case process delay (minimum) of an individual device on one chip is never less than 3 times the worst case process delay (maximum) of the same device on another chip. For example, if a particular gate has a worst case delay of 3 ns, then the fastest this same gate could be is 1 ns for the same technology with the same fan out and load.

Referring now to FIG. 3, the clock input and array clock output on line 230 will be described in relation to a write operation to array 210 and the array address, array write data, and array write enable signal timing.

System clock 170 shown in FIG. 3 has an approximately 50% duty cycle rectangular waveform. The array clock signal is active only for a very short time in each cycle while the array address and write enable signals are active and stable prior to the setup time (Ts) and after the hold times (Th) of the array or clock active time. Effectively, the array clock pulse occurs approximately at the center of the time that the array address and write enable signals are stable as presented to array 210.

It can be seen that the array clock position circuit 220 may eliminate half cycle paths and may reduce hold time to zero relative to any input clock. The fast/slow signal on line 236 indicates to the circuit as to whether the chip is a faster or slower chip relative to a nominal value with respect to propagation delays. This signal can be determined and set by the software based on a test of propagation delay, or it can be dynamically generated by the hardware on an integrated circuit chip. A dynamic hardware mechanism for determining whether a particular integrated circuit chip has fast or slow propagation delays is known to and readily implemented by those skilled in the art.

The array clock positioning circuit according to the present invention allows arrays to be clocked at significantly higher frequency and allows arrays to have multiple gated clocks without incurring hold time problems. Since arrays are very dense, providing the ability to clock at higher rates can have profound effect on the system design and overall system performance.

Although the present invention and its advantages have been described in detail, it should be understood that various changes, substitutions and alterations can be made herein without departing from the spirit and scope of the invention as defined by the appended claims.

What is claimed is:

1. A data processing system comprising:

one or more processors;

a system bus;

a memory system;

a system control unit;

one or more input/output channel control units (IOCC), each of said IOCC units comprising a storage array and a digital clock positioning circuit to position clock signals output from said digital clock pulse positioning circuit to be active when information inputs to said array are stable;

wherein said digital clock pulse positioning circuit further comprises:

a first digital delay circuit for delaying an input signal by a first time duration T1;

a second digital delay circuit responsive to an output of said first digital delay circuit for delaying a signal input to said second digital delay circuit by a second time duration T2; and circuit means responsive to an output of said first digital delay circuit and an output of said second digital delay circuit for providing a positioned clock signal for said array.

2. A data processing system, according to claim 1, further comprising circuit means for selecting one of a plurality of clock signals as an input to said digital clock pulse positioning circuit.

3. A data processing system, according to claim 1, wherein said digital clock pulse positioning circuit further comprises:

a third digital delay circuit responsive to an output of said second digital delay circuit for delaying a signal input to said third digital delay circuit by a third time duration; and a selection circuit for selecting an output of said second digital delay circuit or an output of said third digital delay circuit as an input to said circuit means for providing a positioned clock signal.

4. A data processing system, according to claim 3, wherein said third time duration is equal to said second time duration.

5. A data processing system, according to claim 3, wherein said digital clock pulse positioning circuit further comprises:

control signal means connected to said selection circuit for controlling selection of said output of said second digital delay circuit or said third digital delay circuit, said control signal means responsive to characteristics of circuits in said IOCC unit.

6. A data processing system, according to claim 1, wherein time duration for said first and second digital delay circuits are determined by the following relationship:

T2 equals 1.5 times a predetermined minimum clock pulse width, and T1 equals a predetermined minimum clock active time duration minus T2.

7. An input/output control unit comprising:

a storage array and a digital clock positioning circuit to position clock signals output from said digital clock pulse positioning circuit to be active when information inputs to said array are stable;

wherein said digital clock pulse positioning circuit further comprises:

a first digital delay circuit for delaying an input signal by a first time duration T1;

a second digital delay circuit responsive to an output of said first digital delay circuit for delaying a signal input to said second digital delay circuit by a second time duration T2; and circuit means responsive to an output of said first digital delay circuit and an output of said second digital delay circuit for providing a positioned clock signal for said array.

8. An input/output control unit, according to claim 7, further comprising circuit means for selecting one of a plurality of clock signals as an input to said digital clock pulse positioning circuit.

9. An input/output control unit, according to claim 7, wherein said digital clock pulse positioning circuit further comprises:

a third digital delay circuit responsive to an output of said second digital delay circuit for delaying a signal input to said third digital delay circuit by a third time duration; and a selection circuit for selecting an output of said second digital delay circuit or an output of said third digital delay circuit as an input to said circuit means for providing a positioned clock signal.

10. An input/output control unit, according to claim 9, wherein said third time duration is equal to said second time duration.

11. An input/output control unit, according to claim 9, wherein said digital clock pulse positioning circuit further comprising:

control signal means connected to said selection circuit for controlling selection of said output of said second digital delay circuit where said third digital delay circuit, said control signal means resonsive to characteristics of circuits in said IOCC unit.

12. An input/output control unit, according to claim 7, wherein time duration for said first and second digital delay circuits are determined by the following relationship:

T2 equals 1.5 times a predetermined minimum clock pulse width, and T1 equals a predetermined minimum clock active time duration minus T2.

* * * * *

UNITED STATES PATENT AND TRADEMARK OFFICE
CERTIFICATE OF CORRECTION

PATENT NO. : 5,548,797
DATED : August 20, 1996
INVENTOR(S) : RAVI K. ARIMILLI et al It is certified that error appears in the above-indentified patent and that said Letters Patent is hereby corrected as shown below:

On the title page, item [54] and column 1, line 3, replace "FIST" with --FIRST--

Column 6, line 48, replace "resonsive" with --responsive--

Signed and Sealed this

Thirtieth Day of September, 1997

Attest:

BRUCE LEHMAN

Attesting Officer

Commissioner of Patents and Trademarks